(12) United States Patent
Volkovich et al.

(10) Patent No.: US 11,018,064 B2
(45) Date of Patent: May 25, 2021

(54) MULTIPLE-TOOL PARAMETER SET CONFIGURATION AND MISREGISTRATION MEASUREMENT SYSTEM AND METHOD

(71) Applicant: KLA CORPORATION, Milpitas, CA (US)

(72) Inventors: Roie Volkovich, Migdal Ha'emek (IL); Eitan Herzel, Givat-Ela (IL)

(73) Assignee: KLA Corporation, Milpitas, CA (US)

( * ) Notice: Subject to any disclaimer, the term of this patent is extended or adjusted under 35 U.S.C. 154(b) by 59 days.

(21) Appl. No.: 16/496,914

(22) PCT Filed: Aug. 23, 2019

(86) PCT No.: PCT/US2019/047795
§ 371 (c)(1),
(2) Date: Sep. 23, 2019

(87) PCT Pub. No.: WO2020/122996
PCT Pub. Date: Jun. 18, 2020

(65) Prior Publication Data
US 2021/0028070 A1 Jan. 28, 2021

Related U.S. Application Data

(60) Provisional application No. 62/778,656, filed on Dec. 12, 2018.

(51) Int. Cl.
| | | |
|---|---|---|
| H01L 21/66 | (2006.01) | |
| H01L 21/67 | (2006.01) | |
| G03F 7/20 | (2006.01) | |

(52) U.S. Cl.
CPC ........ *H01L 22/12* (2013.01); *H01L 21/67294* (2013.01); *G03F 7/70633* (2013.01)

(58) Field of Classification Search
CPC .......................... G03F 7/70633; H01L 22/12; H01L 21/67294
See application file for complete search history.

(56) References Cited

U.S. PATENT DOCUMENTS

| | | | |
|---|---|---|---|
| 6,607,926 B1 * | 8/2003 | Toprac ................ | G03F 7/70633 257/E21.525 |
| 6,774,998 B1 * | 8/2004 | Wright ................ | G03F 7/70633 356/399 |

(Continued)

FOREIGN PATENT DOCUMENTS

| | | |
|---|---|---|
| KR | 101730917 B1 | 4/2017 |
| WO | 2010080732 A2 | 7/2010 |

OTHER PUBLICATIONS

IPO, ISR for PCT/US2019/047795, dated Dec. 9, 2019.

*Primary Examiner* — Seahvosh Nikmanesh
(74) *Attorney, Agent, or Firm* — Hodgson Russ LLP

(57) ABSTRACT

A multiple-tool parameter set configuration and misregistration measurement system and method useful in the manufacture of semiconductor devices including using a first misregistration metrology tool using a first set of measurement parameters to measure misregistration between at least two layers at multiple sites on a wafer, including a plurality of semiconductor devices, the wafer being selected from a batch of wafers including a plurality of semiconductor devices intended to be identical to corresponding semiconductor devices on all other wafers in the batch of wafers, thereby generating a plurality of first misregistration data sets, using a second misregistration metrology tool using a second set of measurement parameters to measure misregistration between the at least two layers at multiple sites on a wafer selected from the batch of wafers, thereby generating a plurality of second misregistration data sets, selecting an adjusted first set of modeled measurement parameters associated with the first misregistration data sets and an (Continued)

adjusted second set of modeled measurement parameters associated with the second misregistration data sets, thereby generating a matched misregistration data set and thereafter measuring misregistration between at least two layers of at least one additional wafer, selected from the batch of wafers, using at least one of the first misregistration metrology tool using the adjusted first set of modeled measurement parameters and the second misregistration metrology tool using the adjusted second set of modeled measurement parameters.

20 Claims, 7 Drawing Sheets

(56) References Cited

U.S. PATENT DOCUMENTS

| | | | |
|---|---|---|---|
| 7,478,019 B2 | 1/2009 | Zangooie et al. | |
| 10,234,401 B2 * | 3/2019 | Buhl | H01L 22/20 |
| 10,317,198 B2 * | 6/2019 | Immer | G03F 7/70633 |
| 10,522,427 B2 * | 12/2019 | Chan | G05B 19/41865 |
| 10,769,320 B2 * | 9/2020 | Kuznetsov | G06F 30/20 |
| 10,775,323 B2 * | 9/2020 | Gellineau | G01N 23/205 |
| 10,817,999 B2 * | 10/2020 | Gready | G06T 7/001 |
| 10,887,580 B2 * | 1/2021 | Kolchin | G01N 21/9505 |
| 2004/0032582 A1 * | 2/2004 | Johnson | G01N 21/956 356/237.2 |
| 2004/0169861 A1 * | 9/2004 | Mieher | G03F 7/70625 356/400 |
| 2005/0195398 A1 * | 9/2005 | Adel | G03F 7/70683 356/401 |
| 2013/0304424 A1 * | 11/2013 | Bakeman | G03F 7/70625 702/189 |
| 2016/0047744 A1 * | 2/2016 | Adel | G01B 11/272 356/401 |
| 2016/0282731 A1 | 9/2016 | Pandev | |
| 2017/0045826 A1 * | 2/2017 | Lee | G03F 7/70558 |
| 2018/0253016 A1 | 9/2018 | Demirer et al. | |

* cited by examiner

MULTIPLE-TOOL PARAMETER SET CONFIGURATION AND MISREGISTRATION MEASUREMENT SYSTEM AND METHOD

REFERENCE TO RELATED APPLICATIONS

Reference is hereby made to U.S. Provisional Patent Application 62/778,656, filed Dec. 12, 2018 and entitled MATCHING BASE MACHINE LEARNING, the disclosure of which is hereby incorporated by reference and priority of which is hereby claimed.

FIELD OF THE INVENTION

The present invention relates to measurement of misregistration in the manufacture of semiconductor devices generally.

BACKGROUND OF THE INVENTION

Various methods and systems are known for measurement of misregistration in the manufacture of semiconductor devices.

SUMMARY OF THE INVENTION

The present invention seeks to provide improved methods and systems for measurement of misregistration in the manufacture of semiconductor devices.

There is thus provided in accordance with a preferred embodiment of the present invention a multiple-tool parameter set configuration and misregistration measurement method useful in the manufacture of semiconductor devices including using a first misregistration metrology tool using, a first set of measurement parameters to measure misregistration between at least two layers at multiple sites on a wafer, including a plurality of semiconductor devices, the wafer being selected from a batch of wafers including a plurality of semiconductor devices intended to be identical to corresponding semiconductor devices on all other wafers in the batch of wafers, thereby generating a plurality of first misregistration data sets, using a second misregistration metrology tool using a second set of measurement parameters to measure misregistration between the at least two layers at multiple sites on a wafer selected from the, batch of wafers, thereby generating a plurality of second misregistration data sets, selecting an adjusted first set of modeled measurement parameters associated with the first misregistration data, sets and an adjusted second set of modeled measurement parameters associated with the second misregistration data sets, thereby generating a matched misregistration data set and thereafter measuring misregistration between at least two layers of at least one additional wafer, selected from the batch of wafers, using at least one of the first misregistration metrology tool using the adjusted first set of modeled measurement parameters and the second misregistration metrology tool using the adjusted second set of modeled measurement parameters.

In accordance with a preferred embodiment of the present invention, the multiple-tool parameter set configuration and misregistration measurement method also includes analyzing the plurality of first misregistration data sets, thereby generating a first composite misregistration data set and analyzing the plurality of second misregistration data sets, thereby generating a second composite misregistration data set.

in a preferred embodiment of the present invention, the first composite misregistration data set and the second composite misregistration data set are generated by an CDSG machine-learning algorithm. Preferably, the CDSG machine-learning algorithm is generated by at least one of a neural network analysis, a principle component analysis, a supporting vector machine, a decision tree and a gaussian process.

In accordance with a preferred embodiment of the present invention, the generating the matched misregistration data set is performed with an CDSM machine-learning algorithm. Preferably, the CDSM machine-learning algorithm is generated by at least one of a neural network analysis, a principle component analysis, a supporting vector machine, a decision tree and a gaussian process.

In accordance with a preferred embodiment of the present invention, the first misregistration metrology tool and the second misregistration metrology tool are scatterometry misregistration metrology tools. Preferably, the set of measurement parameters includes at least one of a linear position of a wafer stage used in misregistration measurement, an azimuthal orientation of a wafer stage used in misregistration measurement, an elevation angular orientation of a wafer stage used in misregistration measurement, an axis along which misregistration is measured, a region of interest of a metrology target, a polarization of light used in misregistration measurement, wavelengths of light used in misregistration measurement, a bandwidth of wavelengths of light used in misregistration measurement, an intensity of light used in misregistration measurement, a focal depth used in misregistration measurement, an apodizer used in misregistration measurement and an optics channel used in misregistration measurement. Preferably, the misregistration data set is embodied as a pupil image.

Alternatively, in accordance with a preferred embodiment of the present invention, the first misregistration metrology tool and the second misregistration metrology tool are imaging misregistration metrology tools. Preferably, the set of measurement parameters includes at least one of a linear position of a wafer stage used in misregistration measurement, an azimuthal orientation of a wafer stage used in misregistration measurement, an elevation angular orientation of a wafer stage used in misregistration measurement, an axis along which misregistration is measured, a region of interest of a metrology target, a numerical aperture used in misregistration measurement, a polarization of light used in misregistration measurement, wavelengths of light used in misregistration measurement, a bandwidth of wavelengths of light used in misregistration measurement, an intensity of light used in misregistration measurement, a focal depth used in misregistration measurement and a camera used in misregistration measurement. Preferably, the misregistration data set is embodied as a contrast image.

In accordance with a preferred embodiment of the present invention, the multiple-tool parameter set configuration and misregistration measurement method also includes using at least one additional misregistration metrology tool using an additional set of measurement parameters to measure misregistration between the at least two layers at multiple sites on a wafer selected from the batch of wafers, thereby generating a plurality of additional misregistration data sets, selecting an adjusted at least one additional set of modeled measurement parameters associated with the additional misregistration data sets, thereby generating a matched misregistration data set and thereafter measuring misregistration between at least two layers of at least one additional wafer, selected from the batch of wafers, using at least one of the first misregistration metrology tool using the adjusted first set of modeled measurement parameters, the second misregistration metrology tool using the adjusted second set of modeled measurement parameters and the at least one additional misregistration metrology tool using the adjusted at least one additional set of modeled measurement parameters.

There is also provided in accordance with another preferred embodiment of the present invention, a multiple-tool parameter set configuration and misregistration measurement system useful in the manufacture of semiconductor devices including a first misregistration metrology tool operative to use a first set of measurement parameters to measure misregistration between at least two layers at multiple sites on a wafer including a plurality of semiconductor devices, the wafer being selected from a batch of wafers including a plurality of semiconductor devices intended to be identical to corresponding semiconductor devices on all other wafers in the batch of wafers, thereby generating a plurality of first misregistration data sets, a second misregistration metrology tool operative to use a second set of measurement parameters to measure misregistration between the at least two layers at multiple sites on a wafer selected from the batch of wafers, thereby generating a plurality of second misregistration data sets and a data set matcher operative to select an adjusted first set of modeled measurement parameters associated with the first misregistration data sets and an adjusted second set of modeled measurement parameters associated with the second misregistration data sets, thereby generating a matched misregistration data set, communicate the, adjusted first set of modeled measurement parameters to the first misregistration metrology tool and communicate the adjusted second set of modeled measurement parameters to the second misregistration metrology tool.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

It is appreciated that the system and method described hereinbelow with reference to FIGS. 1-4B form part of a manufacturing process for semiconductor devices, and the misregistration measured by the system and method described hereinbelow with reference to FIGS. 1-4B is used to adjust fabrication processes of the semiconductor devices to more closely align various layers of the semiconductor devices being fabricated.

Figure 1:
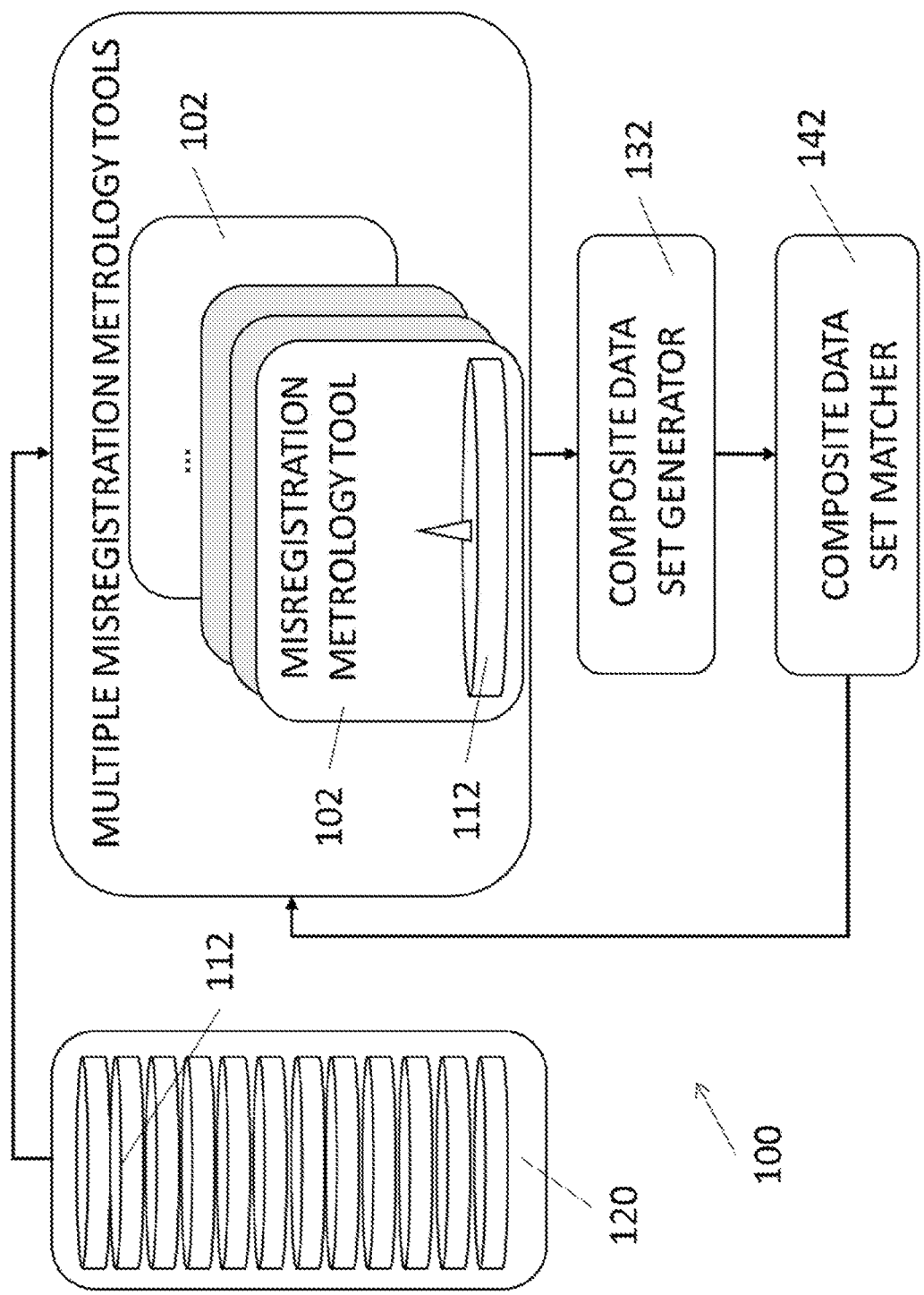
FIG. 1 is a simplified schematic illustration of a multiple-tool parameter set configuration and misregistration measurement system (MTPSCMMS)

Reference is now made to FIG. 1, which is a simplified schematic illustration of a multiple-tool parameter set configuration and misregistration measurement system (MTPSCMMS) 100. As seen in FIG. 1, MTPSCMMS 100 includes two or more misregistration metrology tools 102. Each misregistration metrology tool 102 is operative to generate a plurality of individual site misregistration data sets by measuring, at multiple sites thereon, misregistration between at least two layers formed on a wafer 112. Wafer 112 preferably includes a plurality of semiconductor devices and is selected from a batch of wafers 120. The two or more misregistration metrology tools 102 thereby generate two or more pluralities of individual site misregistration data sets.

It is appreciated that each of wafers 112 in batch of wafers 120 undergo the same fabrication steps and include semiconductor devices which are intended to be identical to corresponding semiconductor devices on all other wafers 112 in batch of wafers 120. It is appreciated that each of the various misregistration metrology tools 102 may measure misregistration between at least two layers of the same wafer 112 or of a different wafer 112 from batch of wafers 120.

Misregistration metrology tools 102 may be any suitable misregistration metrology tools of the same class of misregistration metrology tools, including, inter alia, scatterometry misregistration metrology tools and imaging misregistration metrology tools. A typical scatterometry misregistration metrology tool useful as misregistration metrology tool 102 is an ATL™ 100, commercially available from KLA Corporation of Milpitas, Calif., USA. A typical imaging misregistration metrology tool useful as misregistration metrology tool 102 is an Archer™ 600, commercially available from KLA Corporation of Milpitas, Calif., USA.

It is noted that while each of misregistration metrology tools 102 is of the same class of misregistration metrology tool, each of misregistration metrology tools 102 need not be the same model of misregistration metrology tool. For example, one misregistration metrology tool 102 may be an Archer™ 600 and another misregistration metrology tool 102 may be an Archer™ 700. Similarly, one misregistration metrology tool 102 may be an ATL™ 100 and another misregistration metrology tool 102 may be an ATL™ 200.

In an embodiment wherein misregistration metrology tools 102 are embodied as scatterometry misregistration metrology tools, the misregistration data sets generated by each of the two or more misregistration metrology tools 102 are embodied as a plurality of pupil images, preferably at least one pupil image for each site on the wafer 112 measured by each misregistration metrology tool 102.

In an embodiment wherein misregistration metrology tools 102 are embodied as imaging misregistration metrology tools, the misregistration data sets generated by each of the two or more misregistration metrology tools 102 are embodied as a plurality of contrast images, preferably at least one contrast image for each site on the wafer 112 measured by each misregistration metrology tool 102.

It is appreciated that MTPSCMMS 100 may include more than two misregistration metrology tools 102, provided that all misregistration metrology tools 102 in MTPSCMMS 100 are of the same type, for example, all scatterometry misregistration metrology tools or all imaging misregistration metrology tools. Each misregistration metrology tool 102 in MTPSCMMS 100 is operative to measure misregistration between at least two, layers at multiple sites on a wafer 112 selected from batch of wafers 120, thereby generating a plurality of individual site misregistration data sets corresponding to each misregistration metrology tool 102 in MTPSCMMS 100.

MTPSCMMS 100 further includes a composite data set generator (CDSG) 132. CDSG 132 is operative to analyze and combine each individual site misregistration data set of each of the two or more pluralities of individual site misregistration data sets generated by misregistration metrology tools 102, thereby generating a composite multiple site misregistration data set for each misregistration metrology tool 102.

In an embodiment wherein misregistration metrology tools 102 are embodied as scatterometry misregistration metrology tools, the two or more composite multiple site misregistration data sets generated by CDSG 132 are two or more pupil images, preferably one pupil image for each misregistration metrology tool 102 used. In an embodiment wherein misregistration metrology tools 102 are embodied as imaging misregistration metrology tools, the two or more composite multiple site misregistration data sets generated by CDSG 132 are two or more contrast images, preferably one contrast image for each misregistration metrology tool 102 used.

Preferably, CDSG 132 generates the composite multiple site misregistration data sets using a CDSG machine-learning algorithm (CDSGMLA). CDSGMLA may be any suitable algorithm, such as, inter alia, a neural network analysis, a principle component analysis, a supporting vector machine, a decision tree and a gaussian process.

MTPSCMMS 100 further includes a composite data set matcher (CDSM) 142. CDSM 142 is operative to create model results for each of the two or more composite multiple site misregistration data sets generated by CDSG 132 using a plurality of adjusted sets of modeled measurement parameters, thereby generating a plurality of modeled misregistration data sets for each misregistration metrology tool 102.

The measurement parameters may include, inter alia, a linear position of a wafer stage used in misregistration measurement, an azimuthal orientation of a wafer stage used in misregistration measurement, an elevation angular orientation of a wafer stage used in misregistration measurement, an axis along which misregistration is measured, a region of interest of a metrology target, a polarization of light used in misregistration measurement, wavelengths of light used in misregistration measurement, a bandwidth of wavelengths of light used in misregistration measurement, an intensity of light used in misregistration measurement, a focal depth used in misregistration measurement, an apodizer used in misregistration measurement, an optics channel used in misregistration measurement and a camera used in misregistration measurement.

CDSM 142 is further operative to compare the plurality of modeled misregistration data sets and to select a modeled misregistration data set for each misregistration metrology tool 102 that most closely matches modeled misregistration sets for the other misregistration metrology tools 102 in MTPSCMMS 100, thereby generating a matched misregistration data set for the two or more misregistration metrology tools 102 in MTPSCMMS 100.

Additionally, for each of the two or more misregistration metrology tools 102, CDSM 142 selects the adjusted measurement parameters corresponding to the matched misregistration data set, and sends those adjusted sets of modeled measurement parameters to the corresponding misregistration metrology tools 102 of MTPSCMMS 100.

Preferably, CDSM 142 generates the matched misregistration data sets using an CDSM machine-learning algorithm (CDSMMLA). CDSMMLA may be any suitable algorithm, such as, inter alia, a neural network analysis, a principle component analysis, a supporting vector machine, a decision tree and a gaussian process.

Figure 2A:
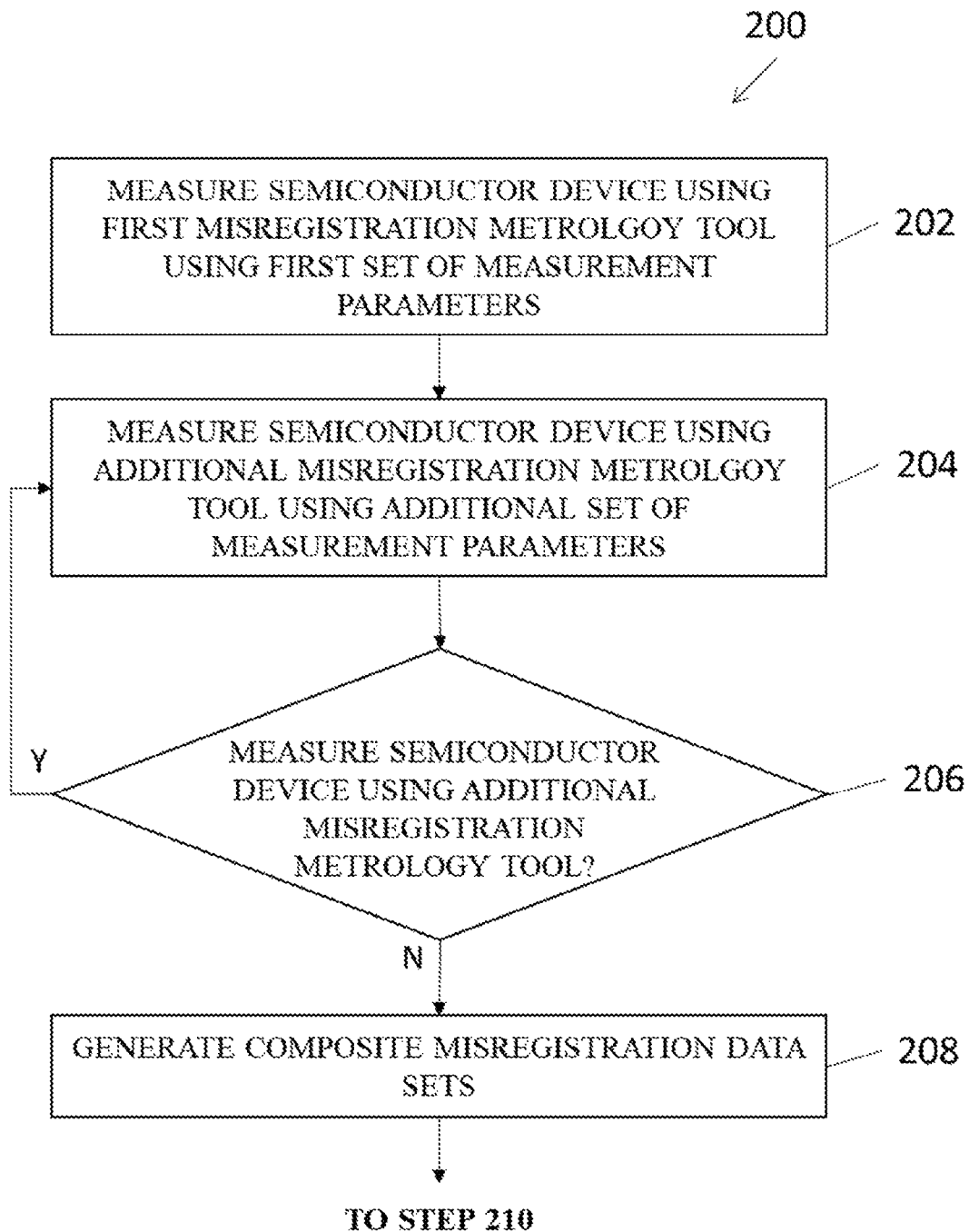
FIGS. 2A & 2B are together a simplified flow chart illustrating a multiple-tool parameter set configuration and misregistration measurement method (MTPSCMMM) useful by the MTPSCMMS of FIG. 1.
Figure 2B:
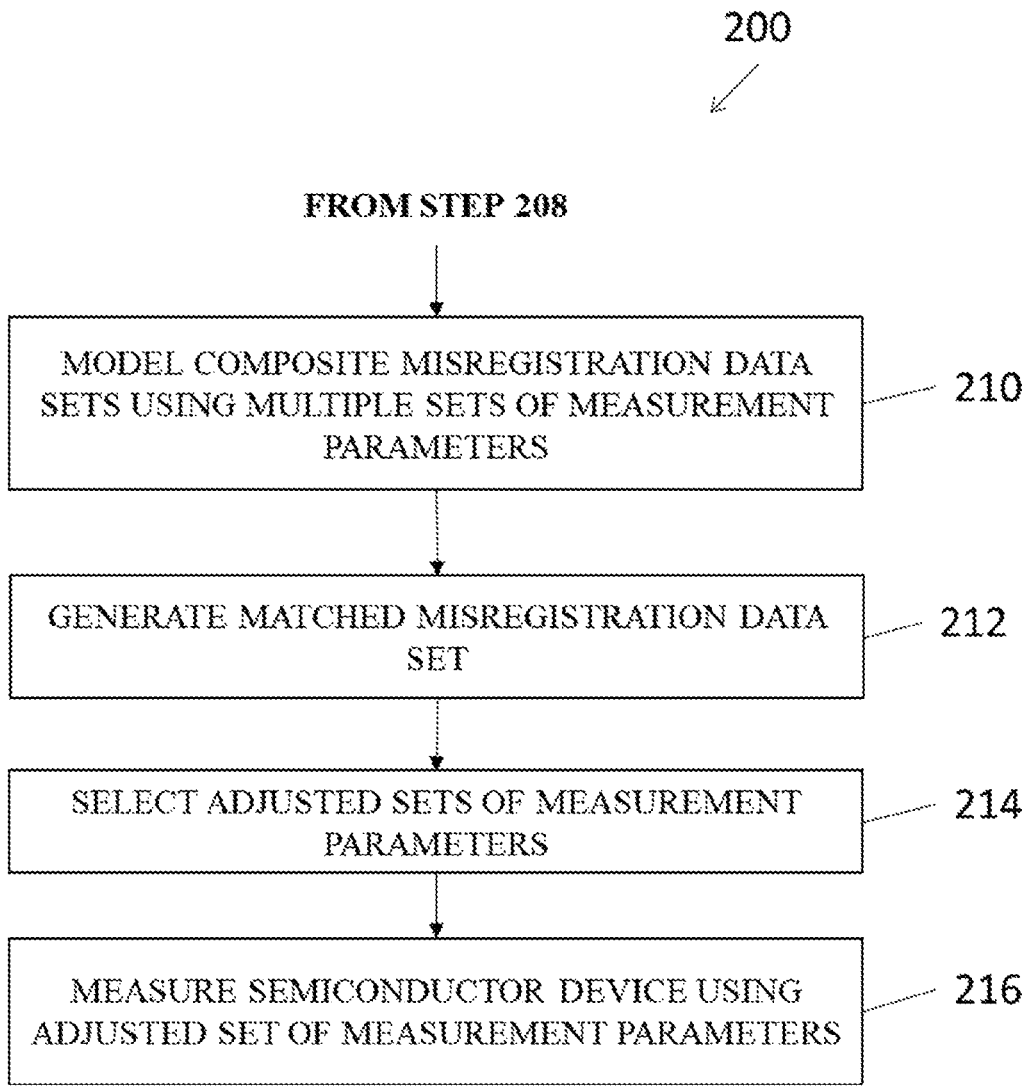

Reference is now made to FIGS. 2A & 2B, which are together a simplified flow chart illustrating a multiple-tool parameter set configuration and misregistration measurement method (MTPSCMMM) 200 useful by MTPSCMMS 100. As seen in FIG. 2A, at a first step 202, a first misregistration metrology tool 102 uses a first set of measurement parameters to measure misregistration between at least two layers at multiple sites on a wafer 112, selected from batch of wafers 120, thereby generating a first plurality of individual site misregistration data sets.

At a next step 204, a second misregistration metrology tool 102 uses a second set of measurement parameters to measure misregistration between at least two layers at multiple sites on a wafer 112, selected from batch of wafers 120, thereby generating a second plurality of individual site misregistration data sets. Then, at a next step 206, a decision is made whether or not to measure either the same wafer 112 or an additional wafer 112, selected from batch of wafers 120, using another misregistration metrology tool 102.

If an additional misregistration metrology tool 102 is to be used to measure a wafer 112, selected from batch of wafers 120, MTPSCMMM 200 returns to step 204 and an additional misregistration metrology tool 102 in MTPSCMMS 100 uses an additional set of measurement parameters to measure misregistration between at least two layers at multiple sites on the wafer 112, selected from batch of waters 120, thereby generating an additional plurality of individual site misregistration data sets.

It is appreciated that misregistration metrology tools 102 used in steps 202 and 204 may be any suitable misregistration metrology tools 102 of the same class of misregistration metrology tools, including, inter alia, scatterometry misregistration metrology tools or imaging misregistration metrology tools. In an embodiment wherein misregistration metrology tools 102 used in steps 202 and 204 are scatterometry misregistration metrology tools, the plurality of individual site misregistration data sets generated throughout MTPSCMMM 200 are pupil images. In an embodiment wherein misregistration metrology tools 102 used in steps 202 and 204 are imaging misregistration metrology tools, the plurality of individual site misregistration data sets generated throughout MTPSCMMM 200 are contrast images.

It is noted that while each of misregistration metrology tools 102 is of the same class of misregistration metrology tool, each of misregistration metrology tools 102 need not be the same model of misregistration metrology tool. For example, one misregistration metrology tool 102 may be an Archer™ 600 and another misregistration metrology tool 102 may be an Archer™ 700. Similarly, one misregistration metrology tool 102 may be an ATL™ 100 and another misregistration metrology tool 102 may be an ATL™ 200.

The sets of measurement parameters used in steps 202 and 204 may include, inter alia, a linear position of a wafer stage used in misregistration measurement, an azimuthal orientation of a wafer stage used in misregistration measurement, an elevation angular orientation of a wafer stage used in misregistration measurement, an axis along which misregistration is measured, a region of interest of a metrology target, a polarization of light used m misregistration measurement, wavelengths of light used in misregistration measurement, a bandwidth of wavelengths of light used in misregistration measurement, an intensity of light used in misregistration measurement, a focal depth used in misregistration measurement, an apodizer used in misregistration measurement, an optics channel used in misregistration measurement and a camera used in misregistration measurement.

If an additional misregistration metrology tool 102 is not to be used to measure a wafer from batch of wafers 120, MTPSCMMM 200 proceeds to a next step 208, whereat CDSG 132 analyzes each of the individual site misregistration data sets generated by each of the misregistration metrology tools 102 used in steps 202 and 204, and generates a composite multiple site misregistration data set for each of the misregistration metrology tools 102 used in steps 202 and 204.

Preferably, at step 208, CDSG 132 generates the composite misregistration data sets using a CDSG machine-learning algorithm (CDSGMLA). CDSGMLA may be any suitable algorithm, such as, inter alia, a neural network analysis, a principle component analysis, a supporting vector machine, a decision tree and a gaussian process.

Figure 3A:
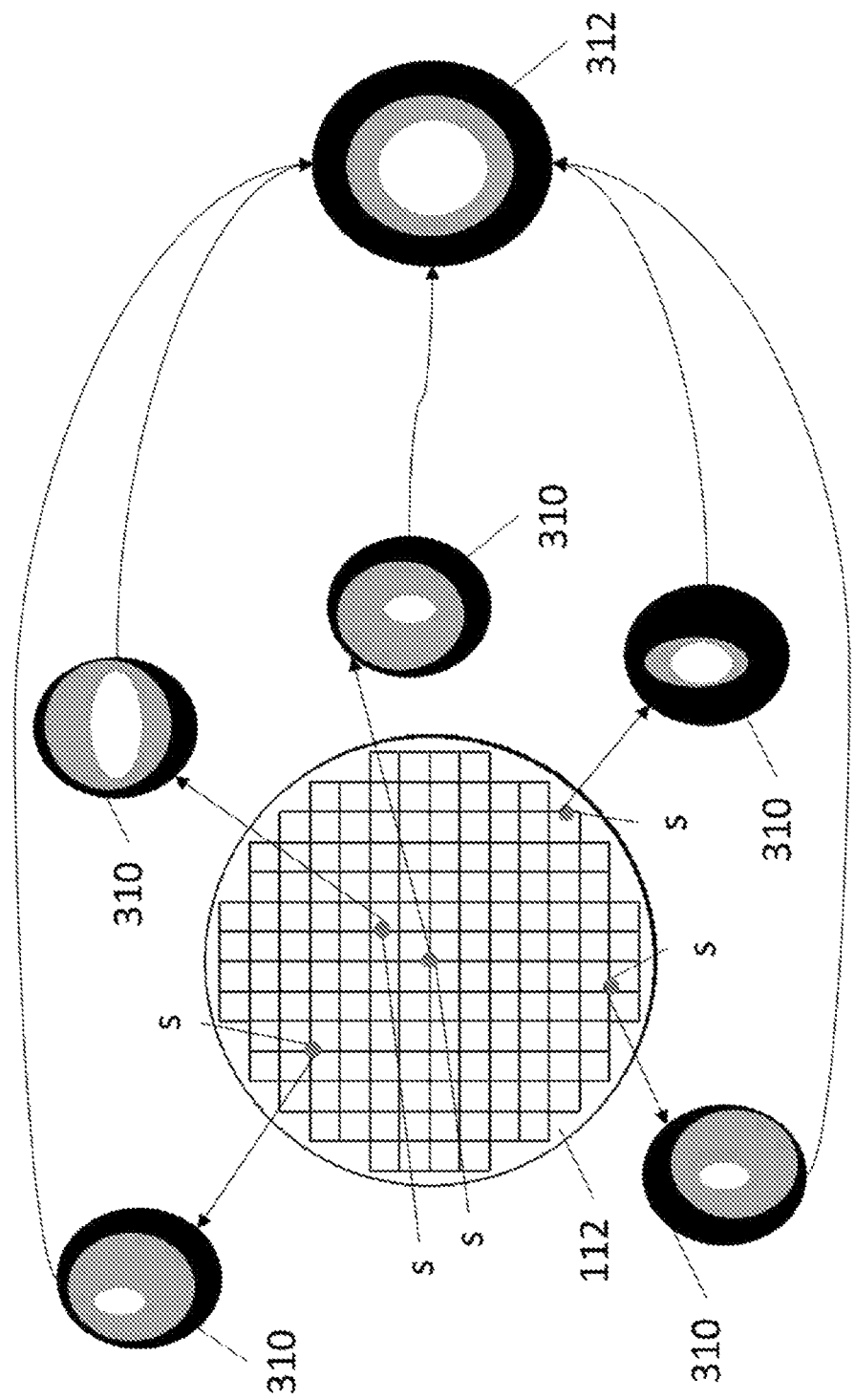
FIGS. 3A & 3B are simplified pictorial illustrations of a first and second embodiment, respectively, of a portion of the MTPSCMMM of FIGS. 2A & 2B.
Figure 3B:
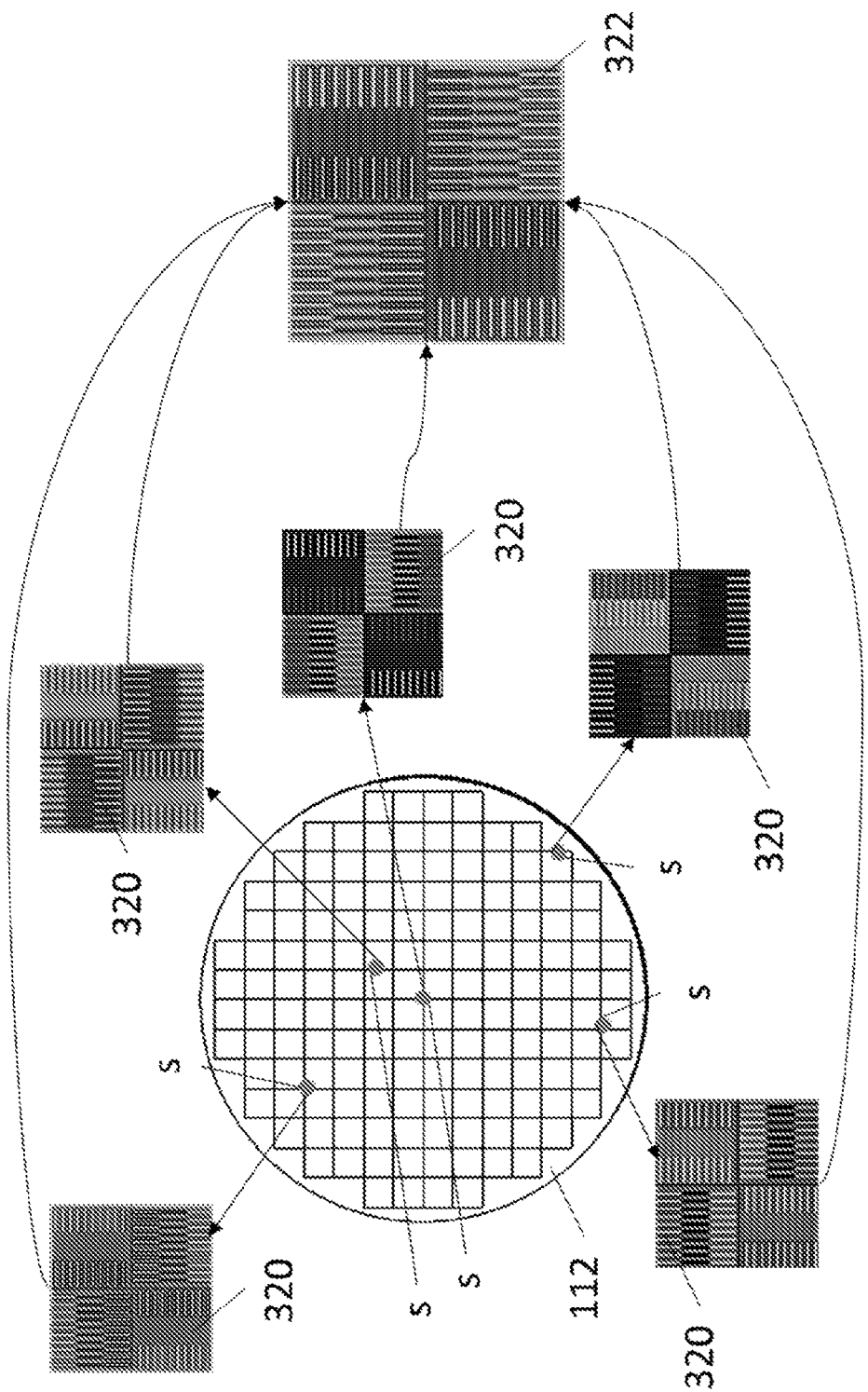

Reference is now additionally made to FIGS. 3A & 3B, which are simplified pictorial illustrations of a first and second embodiment, respectively, of steps 202 & 208 or steps 204 & 208 of MTPSCMMM 200. As seen in FIG. 3A, in an embodiment wherein the misregistration metrology tools 102 used to measure misregistration of wafer 112 in step 202 and 204 are scatterometry misregistration metrology tools, each individual site misregistration data set generated by each misregistration metrology tool 102 at step 202 or step 204 is embodied as a pupil image 310. It is appreciated that although for simplicity, only five pupil images 310 are shown in FIG. 3A, in a typical embodiment of the present invention, between 30-5,000 individual site pupil images are generated by each misregistration metrology tool 102 at step 202 and step 204.

Additionally, in an embodiment wherein misregistration metrology tools 102 are scatterometry misregistration metrology tools, each composite multiple site misregistration data set generated by CDSG 132 at step 208 is embodied as a composite multiple site pupil image 312. CDSG 132 preferably generates one composite multiple site pupil image 312 for each misregistration metrology tool 102 used at each of steps 202 and 204.

As seen in FIG. 3B, in an embodiment wherein the misregistration metrology tools 102 used to measure misregistration of wafer 112 in steps 202 and 204 are imaging misregistration metrology tools, each individual site misregistration data set generated by each misregistration metrology tool 102 at step 202 or step 204 is embodied as a contrast image 320. It is appreciated that although for simplicity, only five contrast images 320 are shown in FIG. 3B, in a typical embodiment of the present invention, between 30-5,000 individual site contrast images are generated by each misregistration metrology tool at step 202 and step 204.

Additionally, in an embodiment wherein misregistration metrology tools 102 are imaging misregistration metrology tools, each composite multiple site misregistration data set generated by CDSG 132 at step 208 is embodied as a composite multiple site contrast image 322. CDSG 132 preferably generates one composite multiple site contrast image 322 for each misregistration metrology tool 102 used at each of steps 202 and 204.

Figure 4A:
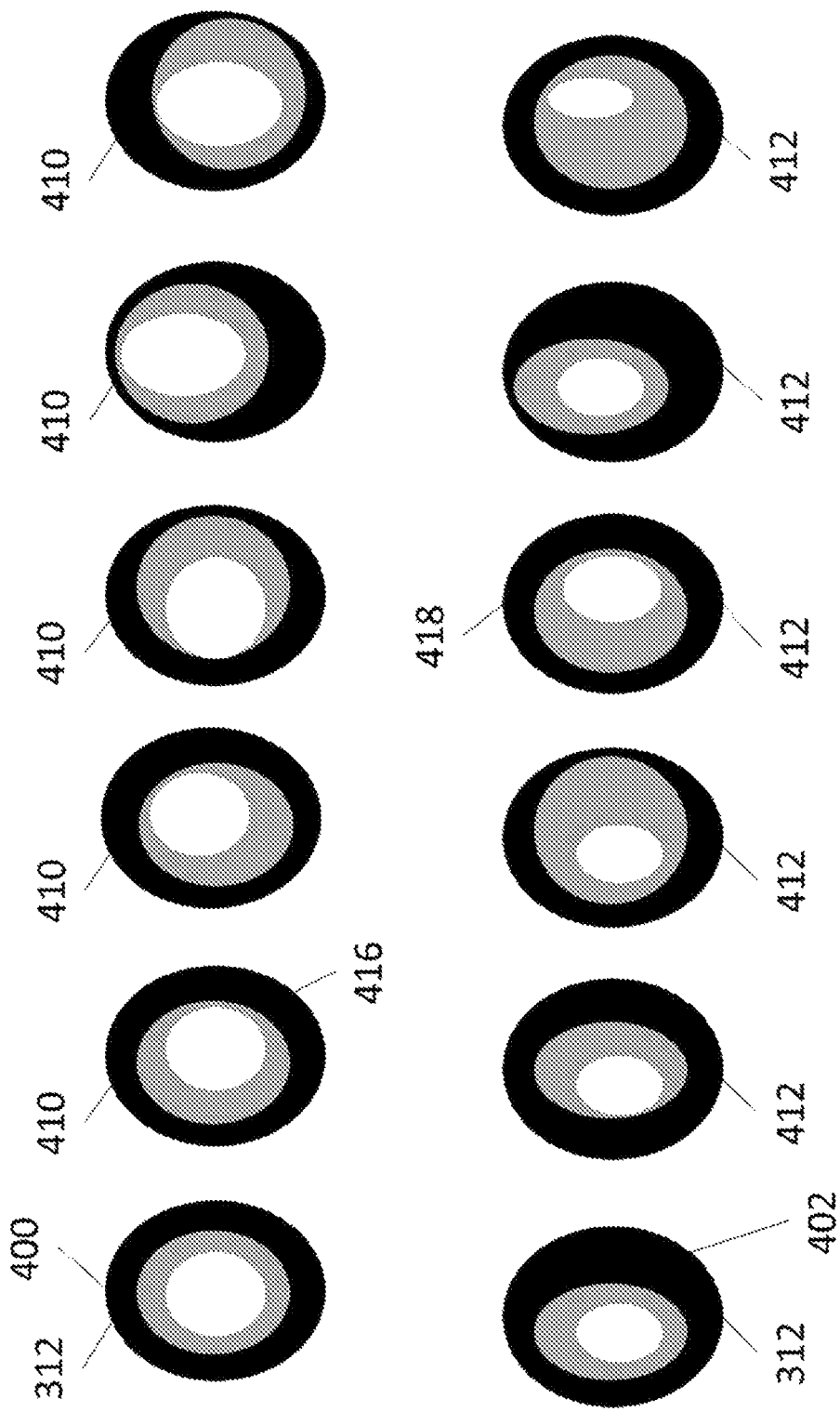
FIGS. 4A & 4B are simplified pictorial illustrations of a first and second embodiment, respectively, of an additional portion of the MTPSCMMM of FIGS. 2A & 2B.

Reference is now additionally made to FIG. 4A, which is a simplified pictorial illustration of a first embodiment of steps 210 and 212 of MTPSCMMM 200. As seen in FIG. 2B and illustrated in FIG. 4A, at a step 210, CDSM 142 uses a plurality of adjusted sets of modeled measurement parameters to model the composite multiple site misregistration data set 312 generated at step 208 for each misregistration metrology tool 102 used in steps 202 and 204, thereby generating a plurality of modeled multiple site misregistration data sets.

In the illustrated embodiment shown in FIG. 4A, the plurality of modeled multiple site misregistration data sets are shown for a first and a second misregistration metrology tool 102, and the composite multiple site misregistration data sets 312 are respectively indicated by reference numbers 400 and 402 for the first and second misregistration metrology tools 102. The modeled multiple site misregistration data sets are indicated by reference number 410 for the first misregistration metrology tool 102 and by reference number 412 for the second misregistration metrology tool 102.

It is appreciated that although for simplicity in FIG. 4A only five modeled multiple site misregistration data sets 410 or 412 are shown for each misregistration metrology tool 102, in a typical embodiment of the present invention, at step 210 between 10-500 modeled multiple site misregistration data sets 410 or 412 are generated for each misregistration metrology tool 102 used in steps 202 and 204.

The sets of modeled measurement parameters used in step 210 may include, inter alia, a linear position of a wafer stage used in misregistration measurement, an azimuthal orientation of a wafer stage used in misregistration measurement, an elevation angular orientation of a wafer stage used in misregistration measurement, an axis along which misregistration is measured, a region of interest of a metrology target, a polarization of light used in misregistration measurement, wavelengths of light used in misregistration measurement, a bandwidth of wavelengths of light used in misregistration measurement, an intensity of light used in misregistration measurement, a focal depth used in misregistration measurement, an apodizer used in misregistration measurement, an optics channel used in misregistration measurement and a camera used in misregistration measurement.

At a next step 212, CDSM 142 compares the plurality of modeled misregistration data sets 410 and 412 for all of the misregistration metrology tools 102 and selects a modeled misregistration data set 410 or 412 for each misregistration metrology tool 102 that most closely matches modeled misregistration sets 410 or 412 for the other misregistration metrology tools 102 in MTPSCMMS 100, thereby generating a matched misregistration data set for misregistration metrology tools 102 in MTPSCMMS 100.

In the example shown in FIG. 4A, CDSM 142 selects the modeled misregistration data set 410 indicated by reference number 416 for the first misregistration metrology tool 102 and the modeled misregistration data set 412 indicated by reference number 418 for the second misregistration metrology tool 102 as the matched misregistration data set.

Figure 4B:
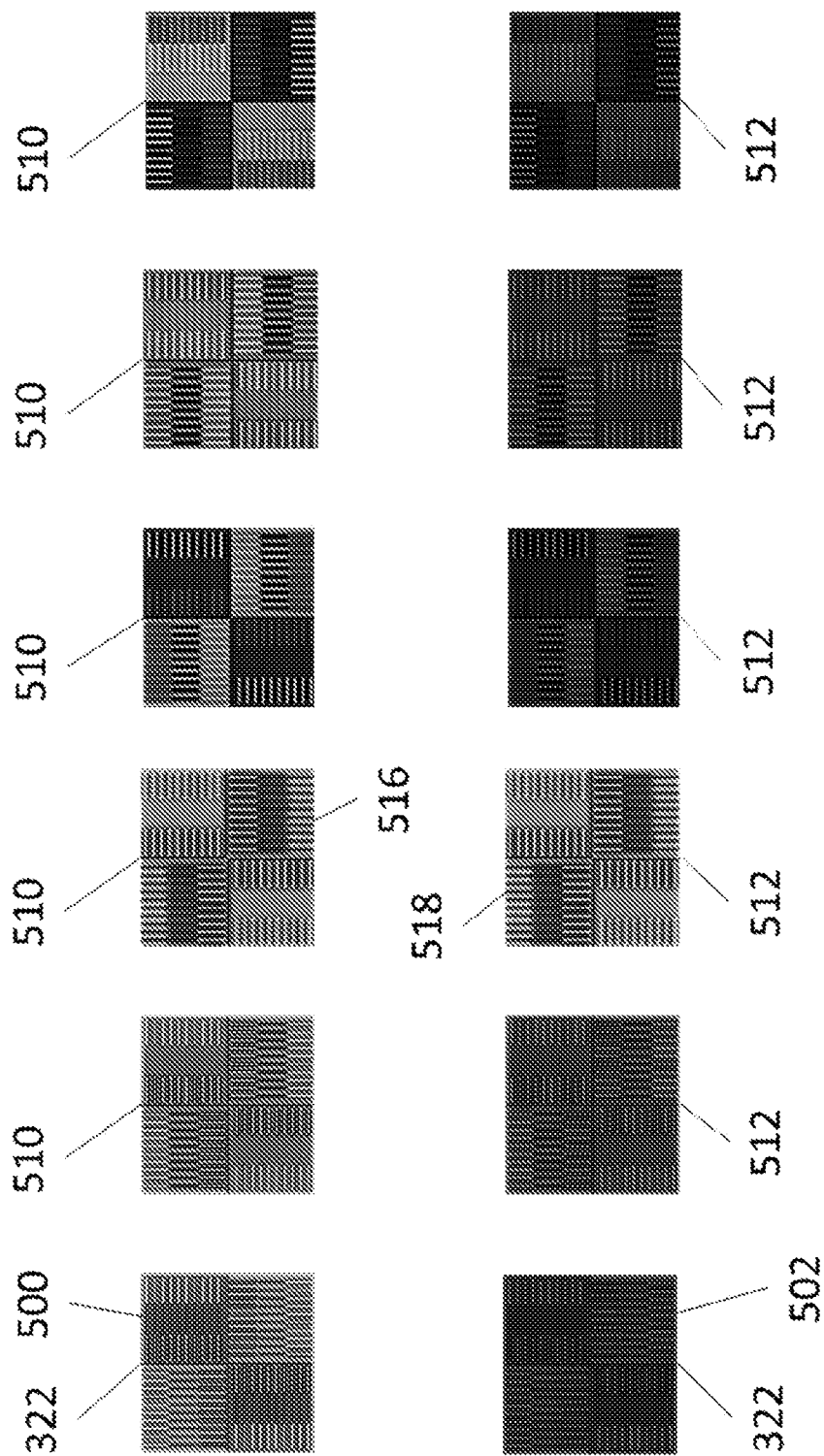

Reference is now additionally made to FIG. 4B, which is a simplified pictorial illustration of a second embodiment of steps 210 and 212 of MTPSCMMM 200. As seen in FIG. 2B and illustrated in FIG. 4B, at a step 210, CDSM 142 uses a plurality of adjusted sets of modeled measurement parameters to model the composite multiple site misregistration data set 322 generated at step 208 for each misregistration metrology tool 102 used in steps 202 and 204, thereby generating a plurality of modeled multiple site misregistration data sets.

In the illustrated embodiment shown in FIG. 4B, the plurality of modeled multiple site misregistration data sets are shown for a first and a second misregistration metrology tool 102, and the composite multiple site misregistration data sets 322 are respectively indicated by reference numbers 500 and 502 for the first and second misregistration metrology tools 102. The modeled multiple site misregistration data sets are indicated by reference number 510 for the first misregistration metrology tool 102 and by reference number 512 for the second misregistration metrology tool 102.

It is appreciated that although for simplicity in FIG. 4B, only five modeled misregistration data sets 510 or 512 are shown for each misregistration metrology tool 102, in a typical embodiment of the present invention, at step 210 between 10-500 modeled misregistration data sets 510 or 512 are generated for each misregistration metrology tool 102 used in steps 202 and 204.

The sets of modeled measurement parameters used in step 210 may include, inter alia, a linear position of a wafer stage used in misregistration measurement, an azimuthal orientation of a wafer stage used in misregistration measurement, an elevation angular orientation of a wafer stage used in misregistration measurement, an axis along which misregistration is measured, a region of interest of a metrology target, a polarization of light used in misregistration measurement, wavelengths of light used in misregistration measurement, a bandwidth of wavelengths of light used in misregistration measurement, an intensity of light used in misregistration measurement, a focal depth used in misregistration measurement, an apodizer used in misregistration measurement, an optics channel used in misregistration measurement and a camera used in misregistration measurement.

At a next step 212, CDSM 142 compares the plurality of modeled misregistration data sets 510 and 512 for all of the misregistration metrology tools 102 and selects a modeled misregistration data set 510 or 512 for each misregistration metrology tool 102 that most closely matches modeled misregistration sets 510 or 512 for the other misregistration metrology tools 102 in MTPSCMMS 100, thereby generating a matched misregistration data set for misregistration metrology tools 102 in MTPSCMMS 100.

In the example shown in FIG. 4B, CDSM 142 selects the modeled misregistration data set 510 indicated by reference number 516 for the first misregistration metrology tool 102 and the modeled misregistration data set 512 indicated by reference number 518 for the second misregistration metrology tool 102 as the matched misregistration data set.

Preferably, the matched misregistration data sets are generated using a CDSM machine-learning algorithm (CDSM-MLA). CDSMMLA may be any suitable algorithm, such as, inter alia, a neural network analysis, a principle component analysis, a supporting vector machine, a decision tree and a gaussian process.

As seen in FIG. 2B, at a next step 214, CDSM 142 selects the adjusted measurement parameters corresponding to the matched misregistration data set generated at step 210, and sends those adjusted sets of modeled measurement, parameters to the corresponding misregistration metrology tools 102 used in steps 202 and 204.

At a next step 216, MTPSCMMM 200 uses at least one of the misregistration metrology tools 102 used in steps 202 and 204, using the corresponding adjusted set or sets of modeled measurement parameters received at step 214, to measure misregistration between at least two layers of at least one additional wafer from batch of wafers 120.

It will be appreciated by persons skilled in the art that the present invention is not limited to what has been particularly shown and described hereinabove. The scope of the present invention includes both, combinations and subcombinations of various features described hereinabove as well as modifications thereof, all of which are not in the prior art.

The invention claimed is:

1. A multiple-tool parameter set configuration and misregistration measurement method useful in the manufacture of semiconductor devices comprising:
   using a first misregistration metrology tool using a first set of measurement parameters to measure misregistration between at least two layers at multiple sites on a wafer comprising a plurality of semiconductor devices, said wafer being selected from a batch of wafers, each wafer in said batch of wafers comprising a plurality of semiconductor devices intended to be identical to corresponding semiconductor devices on all other wafers in said batch of wafers, thereby generating a plurality of first misregistration data sets;
   using a second misregistration metrology tool using a second set of measurement parameters to measure misregistration between said at least two layers at multiple sites on a wafer selected from said batch of wafers, thereby generating a plurality of second misregistration data sets;
   selecting an adjusted first set of modeled measurement parameters associated with said first misregistration data sets and an adjusted second set of modeled measurement parameters associated with said second misregistration data sets, thereby generating a matched misregistration data set; and
   thereafter measuring misregistration between at least two layers of at least one additional wafer, selected from said batch of wafers, using at least one of:
      said first misregistration metrology tool using said adjusted first set of modeled measurement parameters; or
      said second misregistration metrology tool using said adjusted second set of modeled measurement parameters.

2. The multiple-tool parameter set configuration and misregistration measurement method of claim 1 further comprising:
   analyzing said plurality of first misregistration data sets, thereby generating a first composite misregistration data set; and
   analyzing said plurality of second misregistration data sets, thereby generating a second composite misregistration data set.

3. The multiple-tool parameter set configuration and misregistration measurement method of claim 2, wherein said first composite misregistration data set and said second composite misregistration data set are generated by a composite data set generator (CDSG) machine-learning algorithm.

4. The multiple-tool parameter set configuration and misregistration measurement method of claim 1, wherein said generating said matched misregistration data set is performed with a composite data set matcher (CDSM machine-learning algorithm.

5. The multiple-tool parameter set configuration and misregistration measurement method of claim 1, wherein said set of measurement parameters includes at least one of:
   a linear position of a wafer stage used in misregistration measurement;
   an azimuthal orientation of a wafer stage used in misregistration measurement;
   an elevation angular orientation of a wafer stage used in misregistration measurement;

an axis along which misregistration is measured;
a region of interest of a metrology target;
a polarization of light used in misregistration measurement;
wavelengths of light used in misregistration measurement;
a bandwidth of wavelengths of light used in misregistration measurement;
an intensity of light used in misregistration measurement;
a focal depth used in misregistration measurement;
an apodizer used in misregistration measurement; or
an optics channel used in misregistration measurement.

6. The multiple-tool parameter set configuration and misregistration measurement method of claim 1, wherein said misregistration data set is embodied as a pupil image.

7. The multiple-tool parameter set configuration and misregistration measurement method of claim 1, wherein said first misregistration metrology tool and said second misregistration metrology tool are imaging misregistration metrology tools.

8. The multiple-tool parameter set configuration and misregistration measurement method of claim 7, and wherein said set of measurement parameters includes at least one of:
a linear position of a wafer stage used in misregistration measurement;
an azimuthal orientation of a wafer stage used in misregistration measurement;
an elevation angular orientation of a wafer stage used in misregistration measurement;
an axis along which misregistration is measured;
a region of interest of a metrology target;
a numerical aperture used in misregistration measurement;
a polarization of light used in misregistration measurement;
wavelengths of light used in misregistration measurement;
a bandwidth of wavelengths of light used in misregistration measurement;
an intensity of light used in misregistration measurement;
a focal depth used in misregistration measurement; or
a camera used in misregistration measurement.

9. The multiple-tool parameter set configuration and misregistration measurement method of claim 7, wherein said misregistration data set is embodied as a contrast image.

10. The multiple-tool parameter set configuration and misregistration measurement method of claim 1 further comprising using at least one additional misregistration metrology tool using an additional set of measurement parameters to measure misregistration between said at least two layers at multiple sites on a wafer selected from said batch of wafers, thereby generating a plurality of additional misregistration data sets;
selecting an adjusted at least one additional set of modeled measurement parameters associated with said additional misregistration data sets, thereby generating a matched misregistration data set; and
thereafter measuring misregistration between at least two layers of at least one additional wafer, selected from said batch of wafers, using at least one of:
said first misregistration metrology tool using said adjusted first set of modeled measurement parameters;
said second misregistration metrology tool using said adjusted second set of modeled measurement parameters; or
said at least one additional misregistration metrology tool using said adjusted at least one additional set of modeled measurement parameters.

11. A multiple-tool parameter set configuration and misregistration measurement system useful in the manufacture of semiconductor devices comprising:
a first misregistration metrology tool operative to use a first set of measurement parameters to measure misregistration between at least two layers at multiple sites on a wafer comprising a plurality of semiconductor devices, said wafer being selected from a batch of wafers, each wafer in said batch of wafers comprising a plurality of semiconductor devices intended to be identical to corresponding semiconductor devices on all other wafers in said batch of wafers, thereby generating a plurality of first misregistration data sets;
a second misregistration metrology tool operative to use a second set of measurement parameters to measure misregistration between said at least two layers at multiple sites on a wafer selected from said batch of wafers, thereby generating a plurality of second misregistration data sets; and
a data set matcher operative to:
select an adjusted first set of modeled measurement parameters associated with said first misregistration data sets and an adjusted second set of modeled measurement parameters associated with said second misregistration data sets, thereby generating a matched misregistration data set;
communicate said adjusted first set of modeled measurement parameters to said first misregistration metrology tool; and
communicate said adjusted second set of modeled measurement parameters to said second misregistration metrology tool.

12. The multiple-tool parameter set configuration and misregistration measurement system of claim 11 further comprising a composite data set generator operative to:
analyze said plurality of first misregistration data sets, thereby generating a first composite misregistration data set; and
analyze said plurality of second misregistration data sets, thereby generating a second composite misregistration data set.

13. The multiple-tool parameter set configuration and misregistration measurement system of claim 12, wherein said first composite misregistration data set and said second composite misregistration data set are generated by an CDSG machine-learning algorithm.

14. The multiple-tool parameter set configuration and misregistration measurement system of claim 11, wherein said generating said matched misregistration data set is performed with an CDSM machine-learning algorithm.

15. The multiple-tool parameter set configuration and misregistration measurement system of claim 11, wherein said set of measurement parameters includes at least one of:
a linear position of a wafer stage used in misregistration measurement;
an azimuthal orientation of a wafer stage used in misregistration measurement;
an elevation angular orientation of a wafer stage used in misregistration measurement;
an axis along which misregistration is measured;
a region of interest of a metrology target;
a polarization of light used in misregistration measurement;

wavelengths of light used in misregistration measurement;
a bandwidth of wavelengths of light used in misregistration measurement;
an intensity of light used in misregistration measurement;
a focal depth used in misregistration measurement;
an apodizer used in misregistration measurement; or
an optics channel used in misregistration measurement.

16. The multiple-tool parameter set configuration and misregistration measurement system of claim 11, wherein said misregistration data set is embodied as a pupil image.

17. The multiple-tool parameter set configuration and misregistration measurement system of claim 11, wherein said first misregistration metrology tool and said second misregistration metrology tool are imaging misregistration metrology tools.

18. The multiple-tool parameter set configuration and misregistration measurement system of claim 17, wherein said set of measurement parameters includes at least one of:
a linear position of a wafer stage used in misregistration measurement;
an azimuthal orientation of a wafer stage used in misregistration measurement;
an elevation angular orientation of a wafer stage used in misregistration measurement;
an axis along which misregistration is measured;
a region of interest of a metrology target;
a numerical aperture used in misregistration measurement;
a polarization of light used in misregistration measurement;
wavelengths of light used in misregistration measurement;
a bandwidth of wavelengths of light used in misregistration measurement;
an intensity of light used in misregistration measurement;
a focal depth used in misregistration measurement; or
a camera used in misregistration measurement.

19. The multiple-tool parameter set configuration and misregistration measurement system of claim 17, wherein said misregistration data set is embodied as a contrast image.

20. The multiple-tool parameter set configuration and misregistration measurement system of claim 11, further comprising at least one additional misregistration metrology tool operative to use an additional set of measurement parameters to measure misregistration between said at least two layers at multiple sites on a wafer selected from said batch of wafers, thereby generating a plurality of additional misregistration data sets, and wherein said data set matcher is operative to:
select an adjusted at least one additional set of modeled measurement parameters associated with said additional misregistration data sets, thereby generating a matched misregistration data set; and
communicate said adjusted at least one additional set of modeled measurement parameters to said at least one additional misregistration metrology tools.

* * * * *